United States Patent
Dickey

(10) Patent No.: US 11,742,651 B2
(45) Date of Patent: Aug. 29, 2023

(54) SYSTEMS AND METHODS FOR ARC FAULT DETECTION BUILT-IN-TEST

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 201 days.

(21) Appl. No.: 16/409,680

(22) Filed: May 10, 2019

(65) Prior Publication Data
US 2020/0358281 A1 Nov. 12, 2020

(51) Int. Cl.
| | |
|---|---|
| H02H 3/33 | (2006.01) |
| G01R 35/00 | (2006.01) |
| H02H 1/00 | (2006.01) |
| G01R 31/50 | (2020.01) |

(52) U.S. Cl.
CPC ............ *H02H 3/335* (2013.01); *G01R 35/00* (2013.01); *H02H 1/0015* (2013.01); *G01R 31/50* (2020.01)

(58) Field of Classification Search
CPC ....... H02H 1/0015; H02H 3/335; G01R 35/00
See application file for complete search history.

(56) References Cited

U.S. PATENT DOCUMENTS

| | | | |
|---|---|---|---|
| 4,851,878 A * | 7/1989 | Sumida | G03G 15/50 399/83 |
| 6,421,214 B1 | 7/2002 | Packard et al. | |
| 6,426,634 B1 | 7/2002 | Clunn et al. | |
| 6,456,471 B1 | 9/2002 | Haun et al. | |
| 7,616,413 B2 | 11/2009 | Lee | |
| 8,599,523 B1 * | 12/2013 | Ostrovsky | G08B 21/185 361/45 |
| 9,411,021 B2 | 8/2016 | Suchoff | |
| 9,948,087 B2 | 4/2018 | Haines et al. | |

(Continued)

FOREIGN PATENT DOCUMENTS

| | | |
|---|---|---|
| CN | 105334425 A | 2/2016 |
| CN | 108303599 A | 7/2018 |

(Continued)

OTHER PUBLICATIONS

Extended European Search Report dated Oct. 16, 2020, issued during the prosecution of European Patent Application No. 19212253.9.

(Continued)

*Primary Examiner* — Paresh Patel
(74) *Attorney, Agent, or Firm* — Locke Lord LLP; Scott D. Wofsy; Alicia J. Carroll

(57) ABSTRACT

An arc fault detection system with a built-in-test includes an arc fault detector having a load noise voltage input, a test current input and an arc fault detector output. The system includes a processing unit having a switch in electrical communication with the test current input and an input in electrical communication with the arc fault detector output. A method for testing an arc fault detection system includes generating a new bit with a processing unit and outputting the new bit to a switch operatively connected to the processing unit to at least one of turn the switch on or turn the switch off. The method includes reading a signal at an input of the processing unit.

18 Claims, 5 Drawing Sheets

(56) References Cited

U.S. PATENT DOCUMENTS

| | | |
|---|---|---|
| 10,069,292 B2 | 9/2018 | Li et al. |
| 2006/0125582 A1* | 6/2006 | Mills .................... H01H 71/128 |
| | | 335/172 |
| 2008/0024140 A1* | 1/2008 | Henson ................ H02H 1/0015 |
| | | 324/536 |
| 2010/0188097 A1 | 7/2010 | Sul et al. |
| 2012/0098672 A1* | 4/2012 | Restrepo ................ H02H 3/027 |
| | | 340/815.45 |
| 2016/0041222 A1 | 2/2016 | Handy |
| 2017/0117699 A1 | 4/2017 | Ostrovsky et al. |

FOREIGN PATENT DOCUMENTS

| | | |
|---|---|---|
| EP | 2082466 A2 | 7/2009 |
| WO | 08054806 A2 | 5/2008 |
| WO | 11151267 A2 | 12/2011 |

OTHER PUBLICATIONS

Shen Qinmu et al., "Impact of Electrical Contact Resistance on the High-Speed Transmission and On-Line Diagnosis of Electrical Connector Intermittent Faults", IEEE Access, vol. 5, Apr. 24, 2017, pp. 4221-4232.
Partial European Search Report dated Jun. 26, 2020, issued during the prosecution of European Patent Application No. EP 19212253.9.

* cited by examiner ents of the invention relate to arc fault detection
SYSTEMS AND METHODS FOR ARC FAULT DETECTION BUILT-IN-TEST

BACKGROUND OF THE INVENTION

1. Field of the Invention

Embodiments of the invention relate to arc fault detection systems and more particularly to built-in-tests for use therewith.

2. Description of Related Art

An arc fault detection system detects arcing faults in an electrical distribution system. Traditional arc fault detection systems can be tested at power up or when there is no load switched on to determine whether or not the arc fault detection systems are operating. Otherwise, the detection capability of the arc fault detection systems could be overdriven by the test and potentially miss a true arc fault event.

Such conventional methods and systems have generally been considered satisfactory for their intended purpose. However, there is still a need in the art for improved systems and methods for testing arc fault detection systems. There is also a need for such systems that are easy to make and use. The present disclosure provides a solution for these needs.

SUMMARY OF THE INVENTION

An arc fault detection system with a built-in-test includes an arc fault detector having a load noise voltage input, a test current input and an arc fault detector output. The system includes a processing unit having a switch in electrical communication with the test current input and an input in electrical communication with the arc fault detector output.

The switch can be a radio-frequency stimulator switch. The input of the processing unit can be an analog/digital converter. The current sense lead can be electrically connected to the load noise voltage input of the arc fault detector.

In accordance with another aspect, a method for testing an arc fault detection system includes generating a new bit with a processing unit and outputting the new bit to a switch operatively connected to the processing unit to at least one of turn the switch on or turn the switch off. The method includes reading a signal at an input of the processing unit.

The switch can be a radio-frequency stimulator switch. The input can be an analog/digital converter. The new bit can be one of a sequence of bits in a polynomial pseudo random sequence. The method can include adding the signal reading to an accumulator if the new bit is 1. The method can include subtracting the signal reading from an accumulator if the new bit was zero. The method can include adding an increment to a cycle count. The method can include determining whether the cycle count is greater or equal to a terminal value. The method can include generating another new bit if the cycle count is equal to or less than the terminal value. The method can include determining whether an accumulator in the processing unit is within a tolerance threshold if the cycle count is greater than the terminal value. The method can include decrementing an error count if the accumulator is within the tolerance threshold. The method can include incrementing an error count if the accumulator is outside of the tolerance threshold. Incrementing the error count can include incrementing the error count twice. The method can include determining whether a total error count is greater or less than a pre-determined error count threshold. The method can include reporting an error and turning off a load in a power distribution system if the total error count is greater than the pre-determined error count threshold. The method can include clearing a cycle count if the total error count is less than the pre-determined error count threshold. The method can include comprising determining a cycle count.

In accordance with another aspect, a method for testing an arc fault detection system includes inputting a stimulation signal to an arc fault detection system while the arc fault detection system is monitoring faults. The method includes determining whether the arc fault detection system is operating properly without preventing the arc fault detection system from detecting faults.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
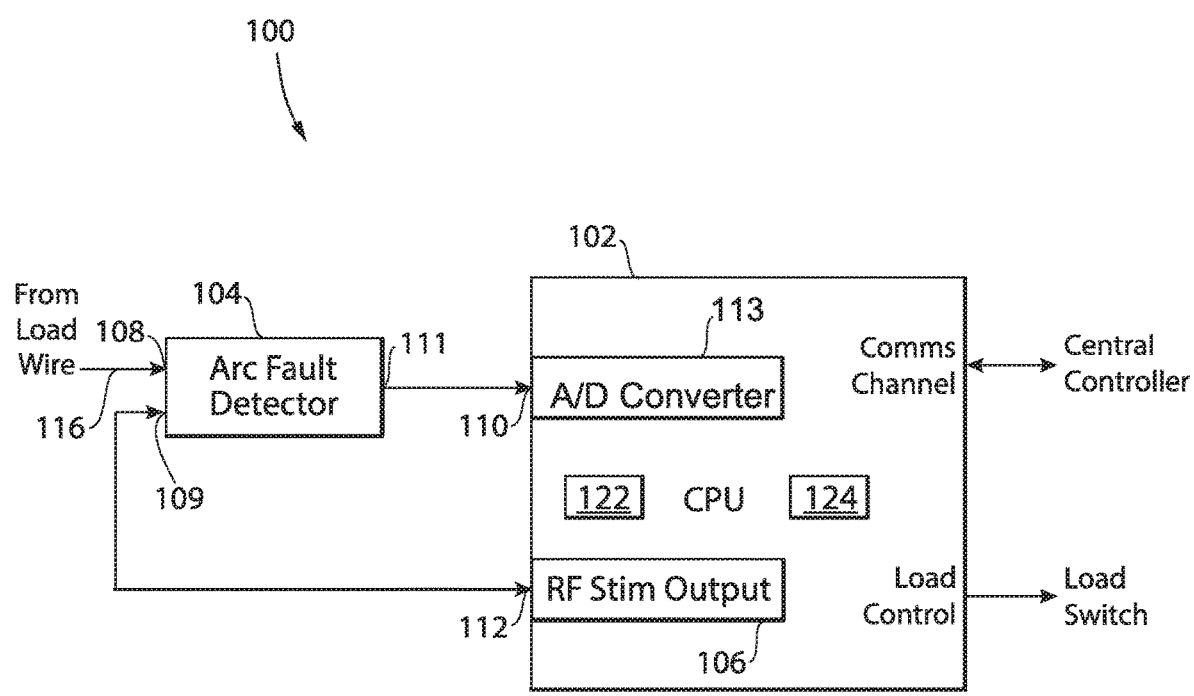
FIG. 1 is a schematic depiction of an arc fault detection system with a built-in-test constructed in accordance with an embodiment of the present disclosure, showing radio-frequency (RF) stimulator switch.

Reference will now be made to the drawings wherein like reference numerals identify similar structural features or aspects of the subject disclosure. For purposes of explanation and illustration, and not limitation, an embodiment of an arc fault detection system in accordance with the disclosure is shown in FIG. 1 and is designated generally by reference character 100. Other embodiments of systems in accordance with the disclosure, or aspects thereof, are provided in FIGS. 2-6, as will be described. The systems and methods described herein can be used to provide real-time testing of the arc fault detector while a power distribution system associated with the arc fault detector is operating a load and while the arc fault detector is being used to monitor the load line and wiring. In other words, the built-in-test operates without interfering with the operation of the arc fault detection algorithm. This acts to reduce latency for fault detection to near zero. The systems and methods described herein also require very little additional circuitry to be added to the arc fault detection system.

An arc fault detection system with a built-in-test 100 includes an arc fault detector 104. The arc fault detector 104 includes a load noise voltage input 108, a test current input 109 and an arc fault detector output 111. The system 100 includes a processing unit 102 having a switch 106, e.g. a radio-frequency (RF) stimulator switch, in electrical communication with the test current input 109. The processing unit 102 includes an input 110 in electrical communication with the arc fault detector output 111. RF stimulator switch 106 outputs a small RF signal via a signal output 112. The RF stimulator switch 106 injects the small RF signal having a given test current into circuitry of the arc fault detector 104 via the current input 109. The test current from RF stimulator switch 106 simulates the specific frequency data associated with the detection range of the RF detector but at a low enough level that it is not determined to be an arc condition. The input 110 of the processing unit 102 is operatively connected to an analog/digital converter 113.

A built-in-test circuit for system 100 includes at least the RF stimulator switch 106. The lead from switch 106 to the test current input 109 can also be considered part of the built-in-test circuit for system 100. In accordance with some embodiments the built-in-test circuit can also include the algorithm of when to apply switch 106 and how to interpret the results. The arc fault detector 104 is used to determine whether the load of a power distribution system is experiencing any arcing faults. Load noise voltage input 108 is operatively connected to a load of a power distribution system via a load wire 116. The processing unit 102 is electrically coupled to the arc fault detector 104 to receive an amplitude signal indicative of the voltage therefrom by way of the input 110 and determine whether any arcing fault is occurring. When the switch 106 is ON, input 110 also receives the voltage resulting from the small RF signal current injected at test current input 109 into the front end of arc fault detector 104. The impedance network of the arc detector 104 coverts the small RF signal current to a small voltage and is processed as a voltage all the way through detector 104 and into the A/D of the processor 102. Over a large number of test samples, both with the switch 106 ON and OFF, system 100 uses an autocorrelation function to separate the current stemming from the small RF stimulation signal, from background noise stemming from the real arc fault RF signal, described in more detail below. In accordance with some embodiments, processor 102 uses a table look up to correct the arc fault input signal received at input 110 by subtracting an estimation of the arc fault output due to the RF stimulation signal before processing the arc fault detection RF signal. This allows the low level RF stimulation signal to occur while the load noise voltage input 108 is being supplied with power.

System 100 operates to pseudo randomly turn the RF stimulator switch 106 "ON" while the load is operating and performs an autocorrelation function to extract the small RF test/stimulation signal from background noise and compare it to the expected value of the stimulation circuit. By using the small RF value of the test current and measuring it over a number of samples, system 100 and the method 200, described below, are able to evaluate the measured voltage value of the test current and use that to test whether the arc fault detector 104 is operating. The pseudo randomness of when the RF stimulator switch 106 is "ON" or "OFF" helps to avoid being interfered with by any repetitive regular noise from the arc fault detector current of system 100.

The processing unit 102 includes an accumulator 122 and a counter 124. Accumulator 122 operates to 'accumulate' the readings from input 110 after each load cycle to keep a running count across a group of cycles. For example, if the RF stimulator switch 106 is "ON", the amplitude signal reading is added to the accumulator 122 value and if the RF stimulator switch 106 is "OFF", the reading is subtracted from the accumulator 122. Ultimately, this results in an accumulated value over a given equal number of "ON" or "OFF" cycles. The accumulator 122 and its function is described in more detail below. The counter 124 operates to count the number of polynomial (PN) cycles conducted. For example, 256 PN cycles, is equivalent to 128 "ON" cycles and 128 "OFF" cycles, in no particular order, which would result in 128 accumulated test current values.

Figure 2:
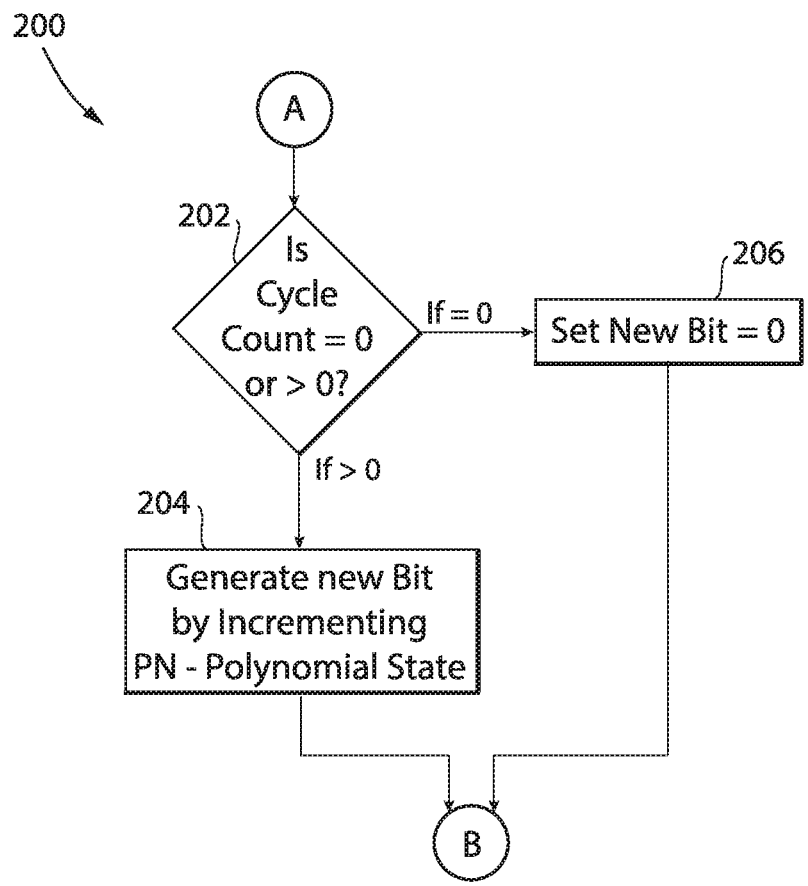
FIGS. 2-6 are flow charts schematically depicting a method for testing the system of FIG. 1 in accordance with embodiments of the present disclosure.

As shown in FIG. 2, a method 200 for testing an arc fault detector, e.g. arc fault detector 104, in an arc fault detection system, e.g. arc fault detection system 100, is shown as starting at block "A" and includes determining a cycle count value of a cycle counter, e.g. counter 124, as indicated schematically by box 202. The method 200 includes generating a new bit with a processing unit, e.g. processing unit 102. If the cycle count is greater than zero, generating the new bit with the processing unit includes generating the new bit by incrementing polynomial (PN) state, as indicated schematically by box 204. This means generating a pseudo random PN bit. If the cycle count is equal to zero, generating the new bit with the processing unit includes setting the new bit to zero, as indicated schematically by box 206. The generated bit is then passed on to the next stage of method 200, as indicated schematically by "B."

Figure 6:
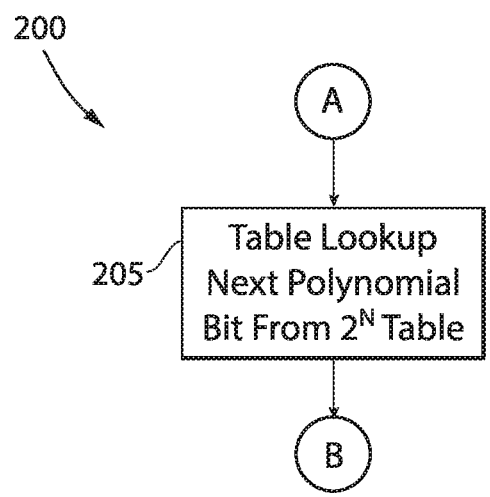

In accordance with some embodiments, instead of determining the cycle count and generating a new bit as shown in FIG. 2. As shown in FIG. 6, method 200 includes looking up the next PN bit from a 2n polynomial look up table, as indicated schematically by box 205. The polynomial lookup table produces the same result output to the switch as generating the bit (as shown schematically by box 204) but may be simpler and quicker to implement for some applications.

Figure 3:
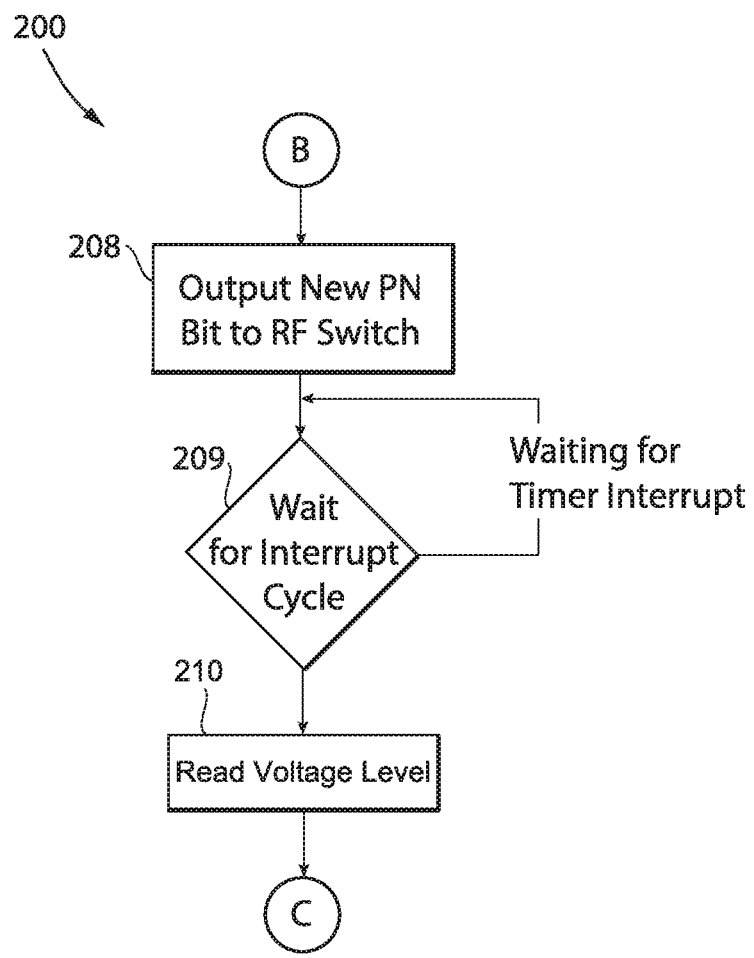

With reference now to FIG. 3, the continuation of method 200 from FIG. 2 is shown. The method 200 includes outputting the new bit (either from box 204 or 206) to a switch, e.g. RF stimulator switch 106, operatively connected to the processing unit to at least one of turn the switch "ON" or turn the switch "OFF," as indicated schematically by box 208. If the PN bit is zero, the switch is turned "OFF" and if the PN bit is one, the switch is turned "ON." When the RF stimulator switch is "OFF" no test current is provided to the test current input. When the RF stimulator switch is "ON" the switch outputs a small RF signal via a signal output, e.g. the signal output 112. In other words, if the PN bit is one, the method includes inputting a stimulation signal to the arc fault detection system, as indicated schematically by box 208. In some embodiments, this inputting occurs while the arc fault detection system is monitoring faults. Due to the pseudo randomness of the PN bit generation (e.g. either a zero or a one), whether the switch is "ON" or "OFF" is random over a given number of cycles. If the switch is "ON" the RF stimulator switch provides an RF stimulation signal to an arc fault detector test current input, e.g. test current input 109.

With reference now to FIGS. 2-3, after outputting the new PN bit, the method 200 includes waiting for a given duration set by the interrupt cycle, as indicated by box 209. This allows time for the signal to propagate through the arc detector 104 and be stable at the input to the A/D. The timing interrupt signals when the switch goes "ON" or "OFF." After the RF level has settled, the method 200 includes reading a voltage signal at an input, e.g. input 110, with an analog/digital converter, e.g. A/D converter 113, of the processing unit, as indicated schematically by box 210. This reading is eventually done for a series of cycles, e.g. 256 cycles, such that method 200 acts to use a long sequence of pseudo random pulses of RF signals injected into the arc fault detector test current input and measures the resulting output at an arc fault detector output, e.g. arc fault detector output 111, by integrating the pulses into a useable signal level thus confirming the arc detector circuit is working. After the voltage at the input is read, the method 200 proceeds to the next stage of method 200, as indicated schematically by "C."

Figure 4:
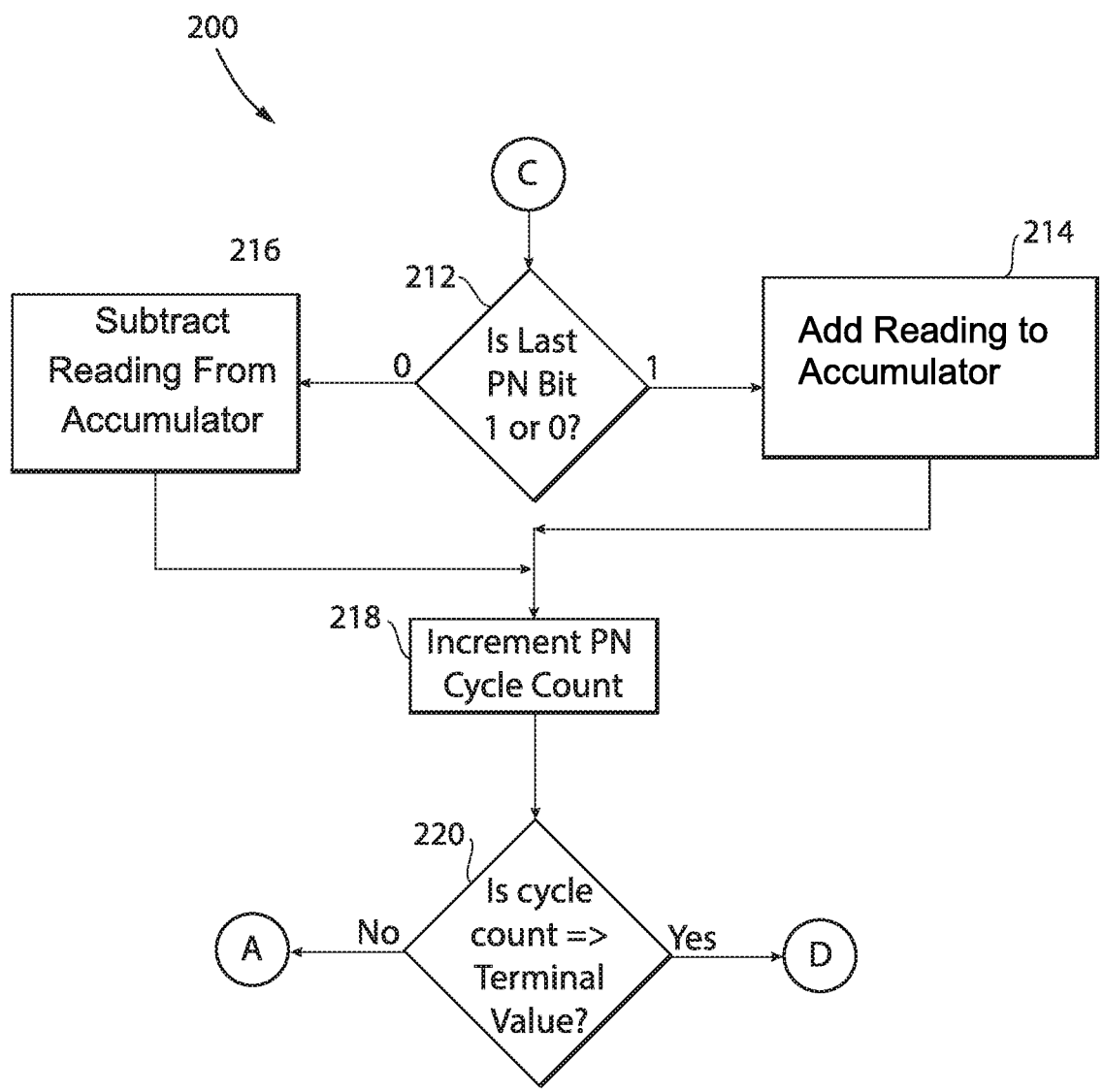

As shown in FIG. 4, after reading the voltage level at the input, determining whether the arc fault detector is operating within a desired parameter includes determining whether the previous PN bit is 0 or 1, as indicated schematically by box 212. FIG. 4 shows the next portion of method 200 after the portion shown in FIG. 3. If the previous PN bit was 1, meaning that the switch was "ON" for the reading of the amplitude, method 200 includes adding the reading, e.g. the voltage level, to an accumulator, e.g. accumulator 122, as indicated schematically by box 214. If the previous PN bit was zero, meaning that the switch was "OFF" for the reading of the amplitude, method 200 includes subtracting the reading from the accumulator, as indicated schematically by box 216. After either adding or subtracting the reading, the method 200 includes incrementing the cycle count kept by the counter, as indicated schematically by box 218. The method 200 includes determining whether the cycle count is equal to or greater than a terminal value, or less than the terminal value, as indicated schematically by box 220. If the cycle count is less than the terminal value of the sequence (e.g. the count is NOT terminal), method 200 includes going back to "A" of method 200 and performs another cycle, e.g. determining the cycle count as shown schematically by box 202, and generating another new bit, as schematically shown by box 204.

As described above, once the terminal cycle count of the sequence has been reached, e.g. after 256 PN bits, where there are equal numbers of PN bits that were one and zero, the value ultimately added to the accumulator is an accumulated value that is representative of an accumulated test injection current value over however many "ON" cycles have passed. Those skilled in the art will readily appreciate that this is due to the fact that when the injection switch is "ON," the value measured is equivalent to the test injection current plus the load noise injected and when the injection switch is "OFF," the value measured is equivalent to just the load noise injected. Because the accumulator adds the measurement when the injection switch is "ON" (+injection current and +load noise signal) and subtracts the load noise signal when the injection switch is OFF (−load noise signal), the voltage value ultimately accumulated in the accumulator at the end of the PN cycle count is equivalent to (+injection current)×N/2 where N is the total number of cycles in the sequence. The counter operates to count the number of PN cycles conducted. For example, 256 PN cycles, is equivalent to 128 "ON" cycles and 128 "OFF" cycles all randomly mixed up in time, which would result in 128 accumulated voltage values that correspond to 128 test current values. The accumulated values allow for an autocorrelation function implemented by method 200 that allows for an accurate measurement of very low RF signals and the associated test current.

Figure 5:
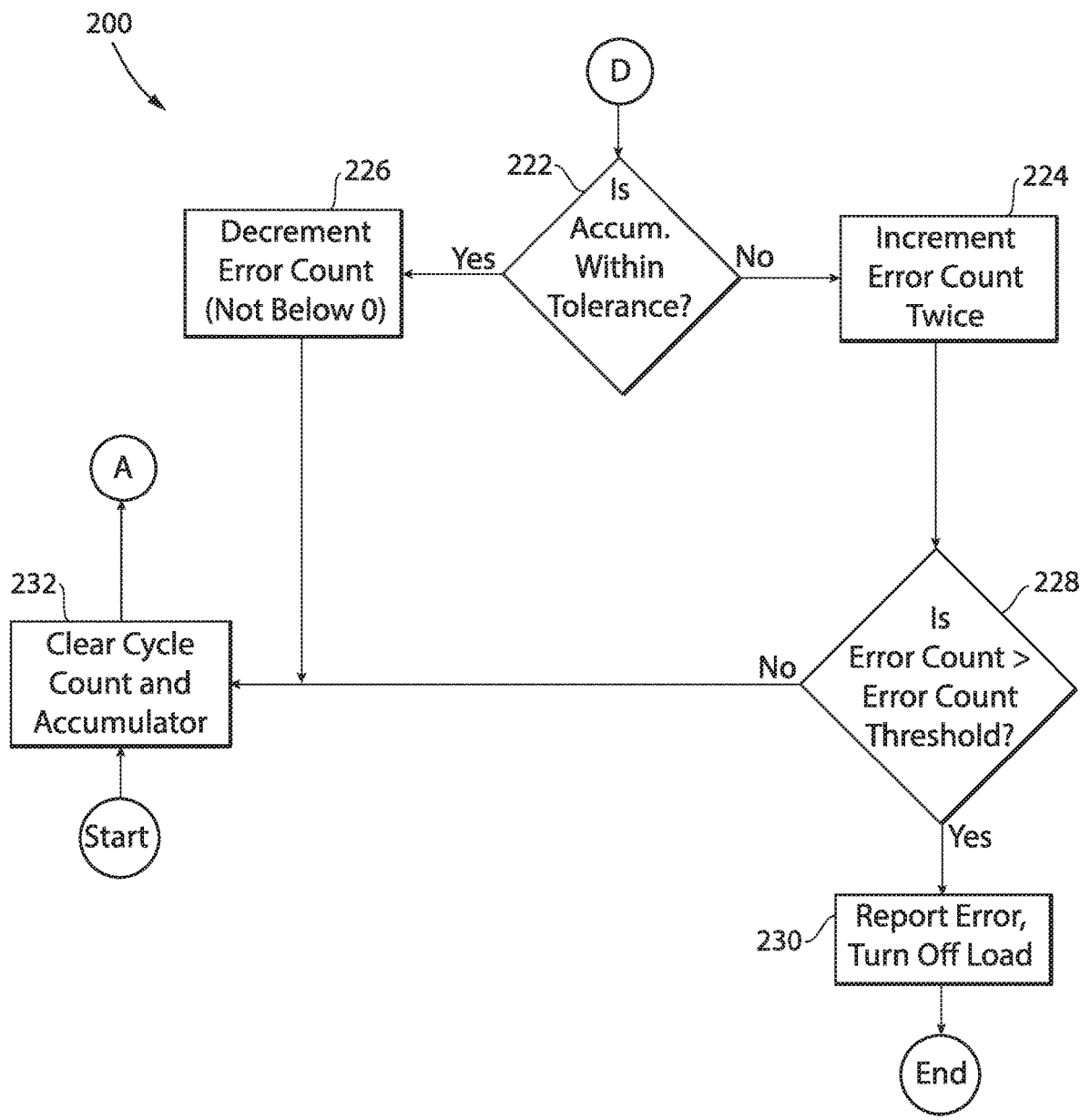

As shown in FIGS. 4-5, if the cycle count is equal to or greater than the terminal value method 200 goes to block "D." The method 200 includes determining whether an accumulator value in the processing unit is within a tolerance threshold, as indicated schematically by box 222. The tolerance threshold can be set based on the expected accumulated current value for an operational arc fault detector. The method 200 includes decrementing an error count toward zero, but not below, if the accumulator is within the tolerance threshold, as indicated schematically by box 226. After decrementing the error count, method 200 includes clearing the cycle count and the accumulator value, as indicated schematically by box 232. The method can then return to block "A" and start a new sequence of cycles, e.g. return to determining a cycle count value of a cycle counter, e.g. counter 124, as indicated schematically by box 202 and repeat the process over and over confirming the status of the arc fault detector. Those skilled in the art will readily appreciate that method 200 can start with clearing the cycle count and the accumulator value, as indicated by the "start" block in FIG. 5, and then go to block "A."

As shown in FIG. 5, the method 200 includes incrementing an error count if the accumulator is outside of the tolerance threshold, as indicated schematically by box 224. Incrementing the error count includes incrementing the error count twice. Those skilled in the art will readily appreciate that there are a variety of other suitable methods and 'slopes' of detection algorithms that can be used here to avoid nuisance faults. For example the increment could be by 3 or 4, instead of just two, thus resulting in a quicker detection but with less assurance. The method 200 includes determining whether a total error count is greater or less than a pre-determined error count threshold, as indicated schematically by box 228. The method 200 includes reporting an error and turning off a load to a power distribution system operatively connected to the arc fault detector if the total error count is greater than the pre-determined error count threshold, as indicated schematically by box 230. If the total error count is equal to or less than the pre-determined error count threshold, method 200 includes clearing the cycle count and the accumulator value if the error count is less than the pre-determined error count threshold, as indicated schematically by box 232. The method can then return to the beginning, e.g. return to determining a cycle count value of a cycle counter, e.g. counter 124, as indicated schematically by box 202. In sum, method 200 includes determining whether the arc fault detection system is operating properly without preventing the arc fault detection system from detecting faults.

The methods and systems of the present disclosure, as described above and shown in the drawings, provide for arc fault systems with a built-in-test having superior properties including improved test sensitivity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An arc fault detection system with a built-in-test:
   an arc fault detector having a load noise voltage input, a test current input and an arc fault detector output; and
   a processing unit having a radio-frequency stimulator switch in electrical communication with the test current input and an input in electrical communication with the arc fault detector output, wherein the processing unit is configured and adapted to randomly generate a new bit to turn the switch "ON" or "OFF".

2. The system as recited in claim 1, wherein the input of the processing unit is an analog/digital converter.

3. The system as recited in claim 1, further comprising a current sense lead electrically connected to the load noise voltage input of the arc fault detector.

4. The system as recited in claim 1, wherein the processing unit includes an accumulator and a counter.

5. A method for testing an arc fault detection system, the method comprising:

outputting a new polynomial (PN) bit from a processing unit to a switch operatively connected to the processing unit to at least one of turn the switch "ON" or turn the switch "OFF,"

inputting a radio-frequency stimulation signal to an arc fault detector, if the PN bit is one and the switch is "ON", while the arc fault detection system is monitoring faults; and determining whether the arc fault detection system is operating properly without preventing the arc fault detector from detecting faults.

6. The method as recited in claim 5, further comprising reading a signal at an input of the processing unit.

7. The method as recited in claim 6, further comprising determining whether a total error count is greater or less than a pre-determined error count threshold.

8. The method as recited in claim 7, further comprising reporting an error and turning off a load in a power distribution system if the total error count is greater than the pre-determined error count threshold.

9. The method as recited in claim 7, further comprising clearing a cycle count if the total error count is less than the pre-determined error count threshold.

10. The method as recited in claim 6, further comprising adding the signal reading to an accumulator if the new bit is 1.

11. The method as recited in claim 6, further comprising subtracting the signal reading from an accumulator if the new bit is zero.

12. The method as recited in claim 6, further comprising adding an increment to a cycle count.

13. The method as recited in claim 12, further comprising determining whether the cycle count is greater or equal to a terminal value.

14. The method as recited in claim 13, further comprising generating another new polynomial (PN) bit if the cycle count is equal to or less than the terminal value.

15. The method as recited in claim 13, further comprising determining whether an accumulator in the processing unit is within a tolerance threshold if the cycle count is greater than the terminal value.

16. The method as recited in claim 15, further comprising decrementing an error count if the accumulator is within the tolerance threshold.

17. The method as recited in claim 15, further comprising incrementing an error count if the accumulator is outside of the tolerance threshold.

18. The method as recited in claim 17, further comprising incrementing the error count includes incrementing the error count twice.

* * * * *